United States Patent [19]
Nakane et al.

[11] Patent Number: 5,546,342
[45] Date of Patent: Aug. 13, 1996

[54] SEMICONDUCTOR MEMORY DEVICE INCLUDING REVERSE AND REWRITE MEANS

[75] Inventors: George Nakane, Nara; Toshio Mukunoki, Takatsuki; Nobuyuki Moriwaki, Kyoto; Tatsumi Sumi, Mishima-gun; Hiroshige Hirano, Nara; Tetsuji Nakakuma, Takatsuki, all of Japan

[73] Assignee: Matsushita Electric Industrial Co., Ltd., Osaka, Japan

[21] Appl. No.: 322,543

[22] Filed: Oct. 13, 1994

[30] Foreign Application Priority Data

Feb. 15, 1994 [JP] Japan .................................. 6-018269

[51] Int. Cl.[6] .................................................. G11C 7/00
[52] U.S. Cl. ........................................ 365/189.01; 365/145
[58] Field of Search ................................ 365/189.01, 145, 365/189.05, 190, 230.03, 200, 201

[56] References Cited

U.S. PATENT DOCUMENTS 3,768,071  10/1993  Knauft et al. .................. 340/146.1
4,045,779   8/1977  Markle ............................ 365/200
4,337,522   6/1982  Stewart .......................... 365/190
4,873,664  10/1989  Eaton, Jr. ....................... 365/145
5,267,204  11/1993  Ashmore, Jr. ................... 365/200

FOREIGN PATENT DOCUMENTS 0172112  2/1988  European Pat. Off. .
0278167  8/1988  European Pat. Off. .

*Primary Examiner*—David C. Nelms
*Assistant Examiner*—Vu A. Le
*Attorney, Agent, or Firm*—McDermott, Will & Emery

[57] ABSTRACT

The life of a semiconductor memory device can be prolonged by using a plurality of memory cells and decreasing the stress applied to the dielectric film of the memory cells storing a data value "1." This is achieved in the present invention by decreasing the number of rewritings required to retain stored data. Specifically, the present invention utilizes a reverse and rewrite means to reverse and rewrite data back into memory cells after being read, memory means for memorizing a signal indicating whether the currently stored data is in a reversed state, and judging means for judging whether the data should be reversely output.

14 Claims, 8 Drawing Sheets

SEMICONDUCTOR MEMORY DEVICE INCLUDING REVERSE AND REWRITE MEANS

BACKGROUND OF THE INVENTION

Dynamic Random Access Memory chips (DRAMs) are widely used among semiconductor memory devices because of their high density and low cost. The basic operation of a DRAM is to record data by storing bits as the presence ("1") or absence ("0") of electrical charge in memory cell capacitors. Silicon oxide film is often used as the dielectric film of the memory cell capacitor of the DRAM, but if the memory data is to be nonvolatile, ferroelectric film may be used instead.

A conventional DRAM using ferroelectric capacitors as taught by prior art is represented in the circuit diagram of FIG. 5. In each cell 30, a pair of bit lines, 35 and 36, or 37 and 38, are connected by MOS transistors 31, 31' to memory cell capacitors 33, 33' as well as to sense amplifiers 41, 42.

The MOS transistors 31, 31' are controlled by a connected word line 32, 34, and memory cell capacitors 33, 33' are connected to cell plate electrodes 39, 40. A control signal φP controls MOS transistors 43, 44, 45, 46, either grounding or precharging bit lines 35, 36, 37, 38. A second control signal φS controls sense amplifiers 41, 42.

In the illustrative example, each memory cell 30 has two memory cell capacitors 33, 33' and two MOS transistors 31, 31'. Data is stored by writing a logical voltage (data value "0" or "1") into a memory cell by storing that value in one of the memory cell capacitors and the opposite value ("1" or "0") in the other memory cell capacitor. This stored data can then be read by connecting the memory cell capacitors to the bit lines and amplifying the voltage difference with the sense amplifier 41, 42.

When the memory cell capacitor is connected to the bit line to read the data, if the value stored was a "0," the memory cell capacitor is not holding any charge and its state is not affected by the read. However, if the value was a "1," the memory cell capacitor charge indicating a voltage is dissipated when the value is read onto the bit line and must be rewritten if the data is to be retained.

Moreover, even if not destroyed by read-outs, because the data is stored in a capacitor, the charge will gradually dissipate. To minimize the chance that a "1" will be mistakenly read as a "0," the bit lines onto which the data are read are connected to sense amplifiers to detect the presence of even slight charges. Eventually however, the stored charge will decrease to a level which may not be detected even by the sense amplifier.

The operation of the prior art memory device of FIG. 5 can be explained in greater detail with reference to FIGS. 6 and 7. FIG. 6 shows a hysteresis curve of the memory cell; FIG. 7 is a timing chart of the operations of memory cell 30a.

As shown in FIG. 7, initially, word line 32, cell plate electrode 39, bit lines 35, 36 and control signal φS are all at a low logical voltage "L," while control signal φP is at a high logical voltage "H." To enable the memory device to read the data stored in memory cell capacitors 33a, 33a', control signal φP is changed to "L" and bit lines 35, 36 are shifted to a floating state. Word line 32 and cell plate electrode 39 are then changed to "H," turning on MOS transistors 31a, 31a' and enabling the data stored in memory cell capacitors 33a, 33a' to be read respectively onto the bit lines 35, 36.

The potential difference between the charges read out from memory cell capacitors 33a, 33a' onto bit lines 35, 36 is shown in the hysteresis curve of FIG. 6. After data is stored in a ferroelectric capacitor and the power supply is cut off, the electric field is zero and the residual polarizations in the ferroelectric capacitor are utilized as nonvolatile data. The residual polarization for high and low voltages are represented respectively by points B and E: When the data value stored in a memory cell is a "1," one of the two memory cell capacitors stands at point B and the other stands at point E. When the data value stored in a memory cell is a "0," the situation is reversed, with the first of the memory cell capacitors at point E and the other at point B.

Still referring to FIG. 6, the slope of straight lines L1, L2 depends on the parasitic capacitance of the bit lines 35, 36: the less parasitic the capacitance, the smaller the absolute value of the slope. Lines L1, L2 are further defined by points M21 and N21, which are shifted horizontally from points B and E respectively, by a magnitude of electric field produced when the voltages of word line 32 and cell plate electrode 39 shift from "L" to "H."

The curves from the points B and E to point D represent the electrical charge held in memory cell capacitors 33a, 33a' as the electrical field changes due to the voltage shift of word line 32 and cell plate electrode 39 from "L" to "H." When a stored data value "1" is read out on bit line 35 from memory cell capacitor 33a, the state of the memory cell capacitor 33a moves from point B to point 021, where the hysteresis curve intersects with line L1 Similarly, the state of memory cell capacitor 33a', which carries an opposite logic value from memory cell capacitor 33a, moves from point E to point P21, where the hysteresis curve intersects with line L2. Thus the read-out potential difference between the pair of bit lines 35, 36 becomes Vr21, the difference of the electric fields between point 021 and point P21.

To read out the data on bit lines 35, 36, the potential difference Vr21 is amplified and control signal φS is shifted from "L" to "H." When the amplification in the sense amplifier 41 is complete, the state of bit line 35 shifts from point 021 to point Q21, and the state of bit line 36 shifts from point P21 to point D.

When the data is read, the charges in the memory cell capacitors 33a, 33a' dissipate and must be rewritten. Voltage at cell plate electrode 39 shifts from "L" to "H," moving bit line 35 from point Q21, to point A, to point B. Similarly, bit line 36 moves from point D to point E. This completes the rewriting process, restoring the semiconductor memory device to its initial state: word line 32 and control signal φS are shifted to "L," control signal φP is shifted to "H," and bit lines 35, 36 are returned to "L" from floating state.

If the value stored in memory cell 30a is "0" rather than "1," with the effect that memory cell capacitor 33a stores a "0" and memory cell capacitor 33a' stores a "1," the states of the bit lines 35, 36 are reversed, but the process remains the same and the potential difference remains Vr21.

In the prior art semiconductor memory device using a dielectric film as described above, every time a memory cell capacitor storing a data value "1" is read, the charge indicating that value is dissipated and must be rewritten. Each rewriting applies stress to the dielectric film of that memory cell capacitor, and the deteriorating effects of repeated stress are particularly severe when ferroelectric film is used, due to the property change when oxygen is emitted by the film: As shown in FIG. 8, repeated writing shrinks the original loop ABDE of the hysteresis curve to the smaller loop abde. As a result, residual electric charges decrease to a level which may result in the stored data being erroneously read.

Accordingly, there exists a need for a semiconductor memory device with an enhanced capability to accurately store data while withstanding multiple read and write operations.

SUMMARY OF THE INVENTION

The present invention provides such a semiconductor memory device having an increased life span. Specifically, the invention comprises a novel semiconductor memory device capable of accurately retaining stored data, while enabling an increased number of read and write operations by alternating representation of a data value between "0" and "1" on subsequent rewrites.

Accordingly, the present invention relates to a semiconductor memory device comprising a plurality of memory cells to store data, with reversing and rewriting means to reverse the stored data before rewriting back into memory. Consequently, the present invention also provides memory means to indicate whether the stored data is in a reversed state, and judging means to judge whether the data must be reversed before being output.

The present invention also relates to a method of storing data in a semiconductor memory device by storing data in a plurality of memory cells, memorizing a signal indicating whether the stored data is in a reversed state, judging on the basis of the memorized signal whether the data should be reversed when output, and reversing and rewriting the data back into the memory cells.

As described in detail below, the semiconductor memory device of the present invention provides important advantages. Specifically, the present invention reduces the number of times a data value "1" will have to be rewritten, which in turn reduces the stress on the dielectric film, prolonging the life of the film and the semiconductor memory device.

The invention itself, together with further objects and attendant advantages, will be understood by reference to the following detailed description, taken in conjunction with the accompanying drawings.

DETAILED DESCRIPTION OF THE DRAWINGS

Figure 1:
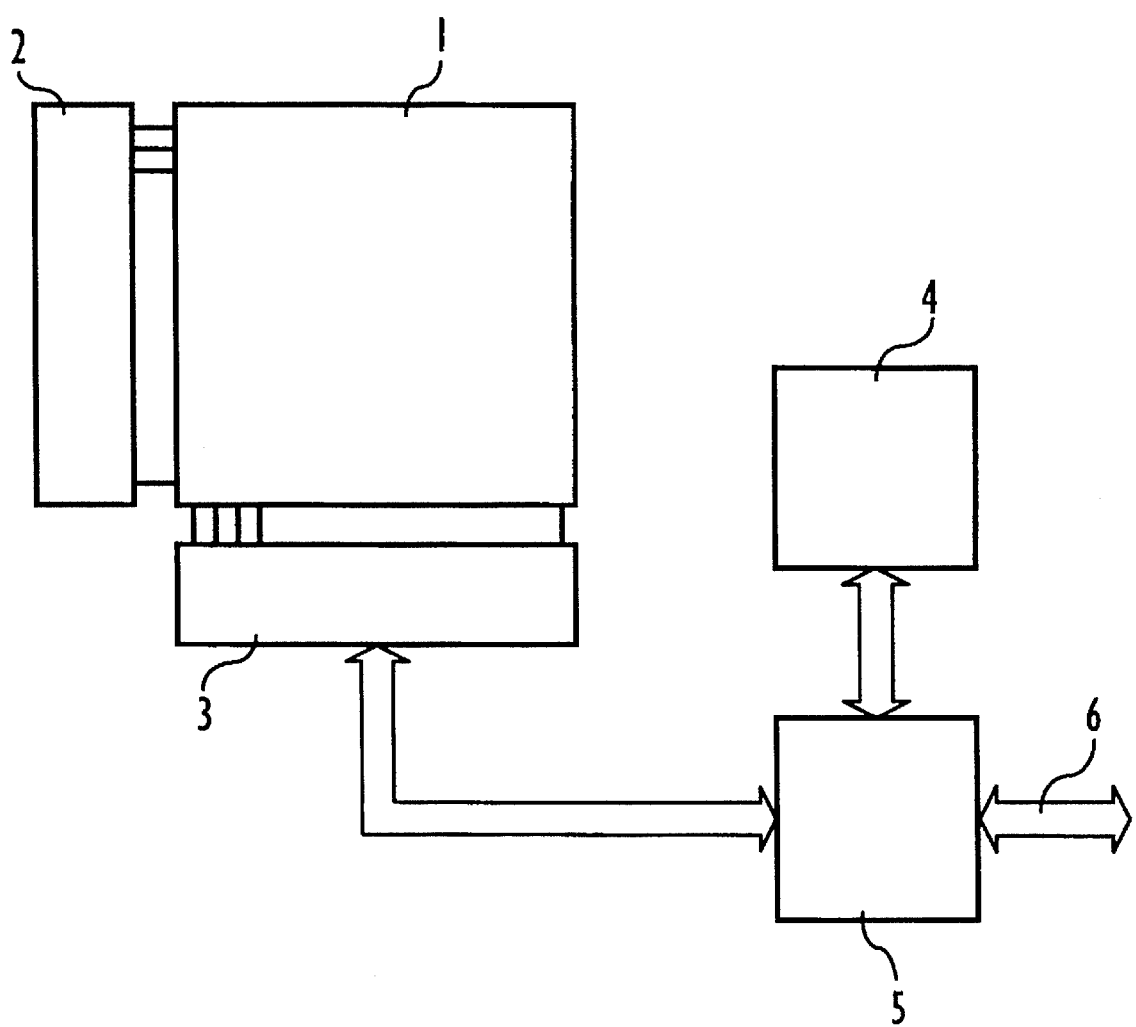
FIG. 1 shows a block circuit diagram of the present invention.

Turning now to the drawings, FIG. 1 illustrates the components of the present invention in a block diagram. As shown, a semiconductor memory device as taught by this invention is comprised of a memory cell array 1 to store data, with a row decoder 2 to select a word line and cell plate electrode within the memory cell array 1, which will be explained in greater detail below with reference to FIG. 2. Column detector 3 selects a sense amplifier and a column switch. Memory circuit 4 memorizes a signal indicating whether data read out from memory cell array 1 are reversed, and on the basis of the signal memorized by memory circuit 4, judging circuit 5 judges whether data read out from memory cell array 1 should be reversed before being output through input output terminal 6.

In the semiconductor memory device of the present invention, data are initially written into the memory cell array 1 by being transmitted through the input output terminal 6 and stored one after another at positions specified by the row decoder 2 and the column decoder 3. The memory circuit 4 memorizes that the series of data is being stored normally (not reversed).

When reading the stored data, the row decoder 2 and the column decoder 3 retrieve and read out the data one after another to the judging circuit 5. After receiving a signal from the memory circuit 4 indicating that the data are normal, the judging circuit 5 outputs the read-out data through the input output terminal 6. The read-out data from the judging circuit 5 is then reversed and rewritten in their specified positions in the memory cell array 1, and a signal indicating that the data are reversed is sent to and memorized by the memory circuit 4 in order to instruct the semiconductor memory device to reverse the data in the next read-out.

Figure 2:
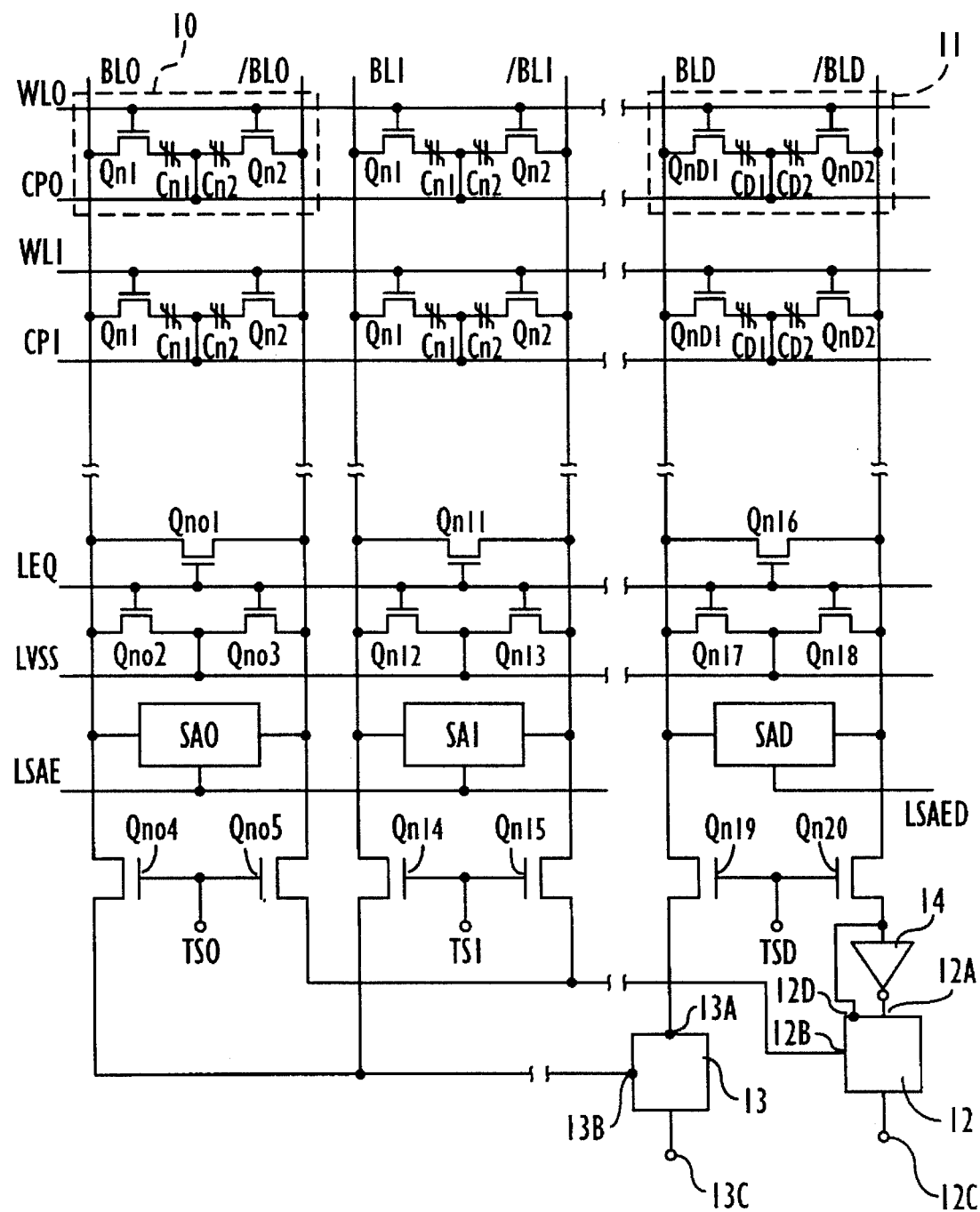
FIG. 2 is a schematic circuit diagram of the present invention.

FIG. 2 shows a schematic circuit diagram of the semiconductor memory device of this invention. This embodiment comprises a plurality of memory cells to store data, a memory circuit comprised of a plurality of "dummy memory cells" to memorize whether the data are normal or reversed, judging circuits 12, 13, and an inverter 14 as a reversing means.

One memory cell 10, representative of the plurality of memory cells, comprises two N-channel MOS transistors Qn1, Qn2 and two ferroelectric capacitors Cn1, Cn2. One dummy memory cell 11, representative of the plurality of dummy memory cells, similarly comprises two N-channel MOS transistors QnD1, QnD2 and two ferroelectric capacitors CD1, CD2. As shown in FIG. 2, the memory cells and dummy memory cells are connected to bit lines BL0,/BL0, BL1,/BL1, BLD,/BLD, word lines WL0, WL1, and cell plate electrodes CP0, CP1. Each memory cell and dummy memory cell has the same structure as memory cell 10 and dummy memory cell 11, respectively.

FIG. 2 further shows the arrangement in the semiconductor memory device of the present invention of: a signal line LEQ supplying a control signal EQ for equalizing as well as precharging the bit lines; N-channel MOS transistors Qn01, Qn02, Qn03, Qn11, Qn12, Qn13, Qn16, Qn17, Qn18 connected to the signal line LEQ; a signal line LVss; sense amplifiers SA0, SA1, SAD; signal lines LSAE, LSAED; and N-channel MOS transistors Qn04, Qn05, Qn14, Qn15, Qn19, Qn20.

The judging circuits 12, 13 are controlled by the data from the dummy memory cells, input via input terminal 12A and input output terminal 13A. A data value "1" indicates the data read out from the memory cell is output as it is, while a data value "0" indicates the data read out from the memory cell is reversed and output from input output terminals 12C, 13C respectively. The data from bit line/BLD is reversed by an inverter 14 and input through the input terminal 12A.

The data read out from the memory cells are reversed by the judging circuits 12, 13 before being rewritten into their initial storage locations in the memory cells. Similarly, the data read out from the dummy memory cells are also reversed before being rewritten into the dummy memory cells. In this case, since the signal from the bit line/BLD is input reversely by inverter 14, the data is directly restored on bit line/BLD during rewriting.

Although the inverter 14 of FIG. 2 is placed outside the judging circuit 12, it may alternatively be included within judging circuit 12.

The operation of the semiconductor memory device of the present invention will now be explained. To write data into a memory cell 10, logical voltage "H" is applied to terminals TS0, TSD which supply control signals S0, SD to the sense amplifiers SA0, SAD, turning on the N-channel MOS transistors Qn04, Qn05, Qn19, Qn20.

Data value "0" is input from input output terminal 12C of judging circuit 12, and data value "1" is input from the input output terminal 13C of judging circuit 13. Data value "1" is sent to bit lines BL0, BLD from input output terminals 13B, 13A; data value "0" is sent to bit lines/BL0,/BLD from input output terminals 12B, 12D. Data value "1" is memorized in ferroelectric capacitor Cn1 of memory cell 10 via bit line/BL0, and data value "0" is memorized in ferroelectric capacitor Cn2 of memory cell 10. At the same time, data value "1" is memorized in ferroelectric capacitor CD1 of dummy memory cell 11, while data value "0" is memorized in ferroelectric capacitor CD2 of dummy memory cell 11.

Figure 3:
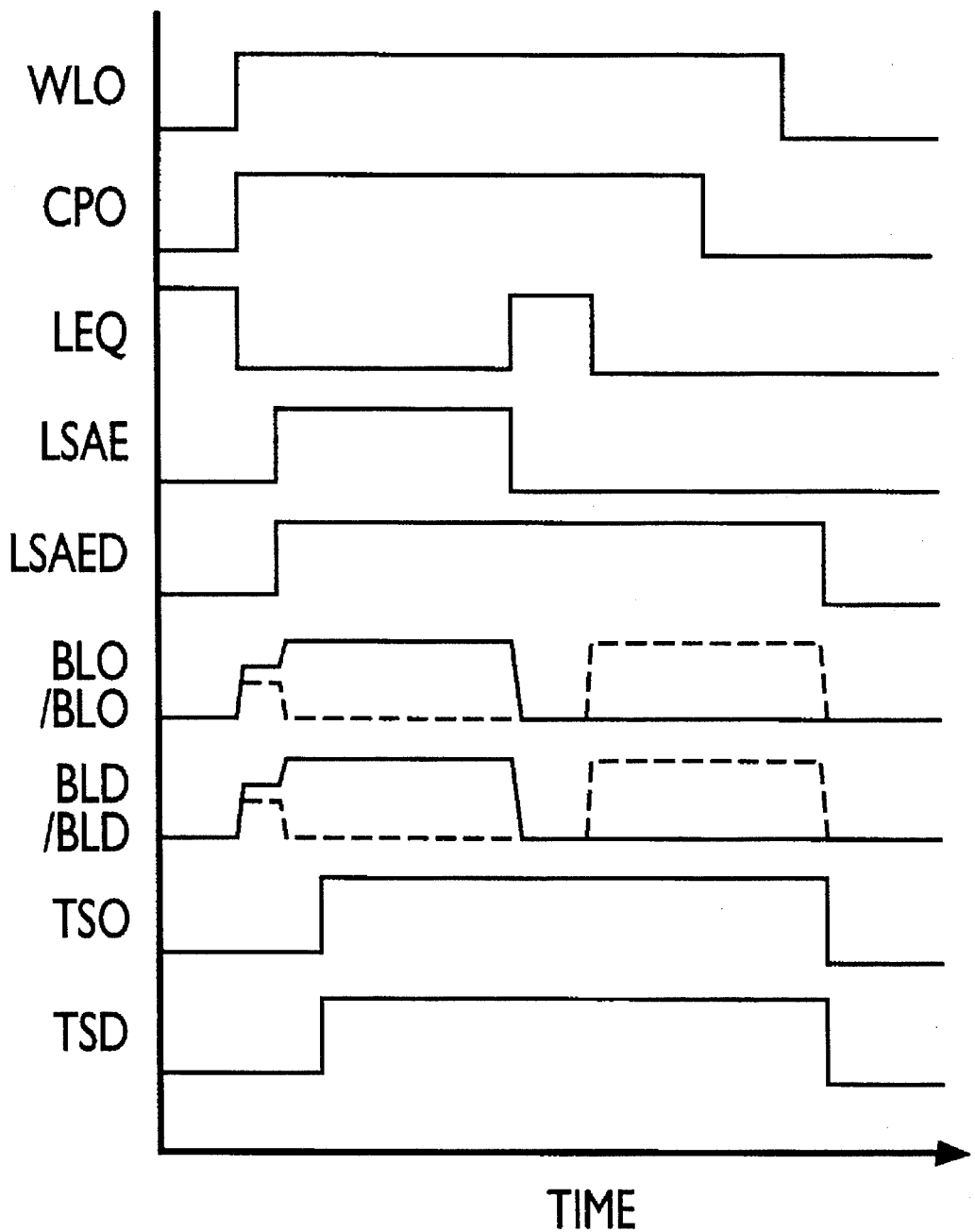
FIG. 3 shows a timing chart of the operation of the present invention.

The read operation of the semiconductor memory device of the present invention will be explained with reference to FIGS. 2 and 3. A logical voltage "H" on signal line LEQ turns on N-channel MOS transistors Qn01, Qn02, Qn03, Qn16, Qn17, Qn18 and grounds bit lines BL0,/BL0, BLD, /BLD.

Switching to logical voltage "L" (low voltage) on signal line LEQ turns off the N-channel MOS transistors Qn01, Qn02, Qn03, Qn16, Qn17, Qn18. When logical voltage "H" is applied to the word line WL0 and the cell plate electrode CP0, N-channel MOS transistors Qn1, Qn2, QnD1, QnD2 turn on, enabling read-outs of data value "1" on bit line BL0, data value "0" on bit line/BL0, data value "1" on bit line BLD, and data value "0" on bit line/BLD.

To amplify the potential difference between each bit line, control signals SAE, SAED are sent to sense amplifiers SA0, SAD. Logical value "H" is then applied to terminals TS0, TSD to turn on N-channel MOS transistors Qn04, Qn05, Qn19, Qn20. At this time, data value "0" of bit line/BL0 is input to judging circuit 12 via input output terminal 12B and data value "1," reversed from data value "0" of bit line/BLD by inverter 14, is input via input terminal 12A. The data read out from memory cell 10 via bit line/BL0 is thus judged normal, and data value "0" is output from the input output terminal 12C.

On the other hand, data value "1" of bit line BL0 via input output terminal 13B and data value "1" of bit line BLD via input output terminal 13A are input into judging circuit 13. The data read out from memory cell 10 via bit line BL0 is thus judged normal, and data value "1" is output from the input output terminal 13C.

After the data has been read out, it must be rewritten. Logical voltage "H" is applied to signal line LEQ to ground all bit lines and logical voltage "L" is applied to the signal line LEQ to rewrite. In this example, data value "1," reversed from an original data value "0," is returned from judging circuit 12 to bit line/BL0 through the input output terminal 12B, and is rewritten into ferroelectric capacitor CD2 of dummy memory cell 11.

Similarly, data value "0," reversed from an original data "1," is returned form judging terminal 13 to bit line BL0 through input output terminal 13B, and is rewritten into the ferroelectric capacitor Cn1 of memory cell 10. Also, data value "0" is returned to the bit line BLD via input output terminal 13A, and is rewritten into ferroelectric capacitor CD1 of dummy memory cell 11. Finally, all signals are held at logical voltage "L" to return the semiconductor memory device to its initial state.

During the next read-out, data value "0" is read out from the bit line BL0 where the original data value was "1," and data value "1" is read out from bit line/BL0 where the original data value was "0."

On the other hand, from dummy memory cell 11, data value "0" is read out via bit line BLD and data value "1" is read out via bit line/BLD. Further, data value "1" from bit line/BLD is reversed to data value "0" by inverter 14. These data are then respectively input into judging circuits 12, 13. Thus, data value "1" from bit line/BL0 is reversed in judging circuit 12 before being output as data value "0" to input output terminal 12C; data value "0" from bit line BL0 is reversed in judging circuit 13 before being output as data value "1" to input output terminal 13C.

Although the above operation is described with respect to memory cell 10, the same operation may be carried out on corresponding components of other memory cells.

Figure 4:
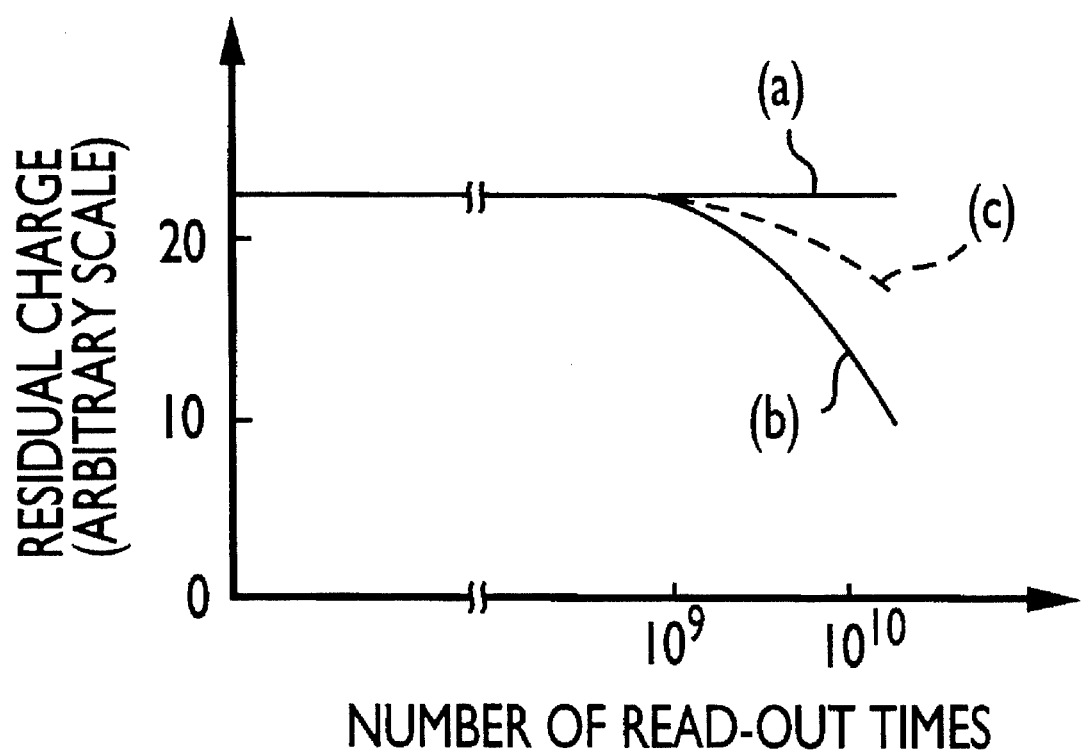
FIG. 4 shows the relation between the number of data read-outs and the residual electric charge in both a semiconductor memory device of the present invention and a conventional semiconductor memory device.
Figure 5:
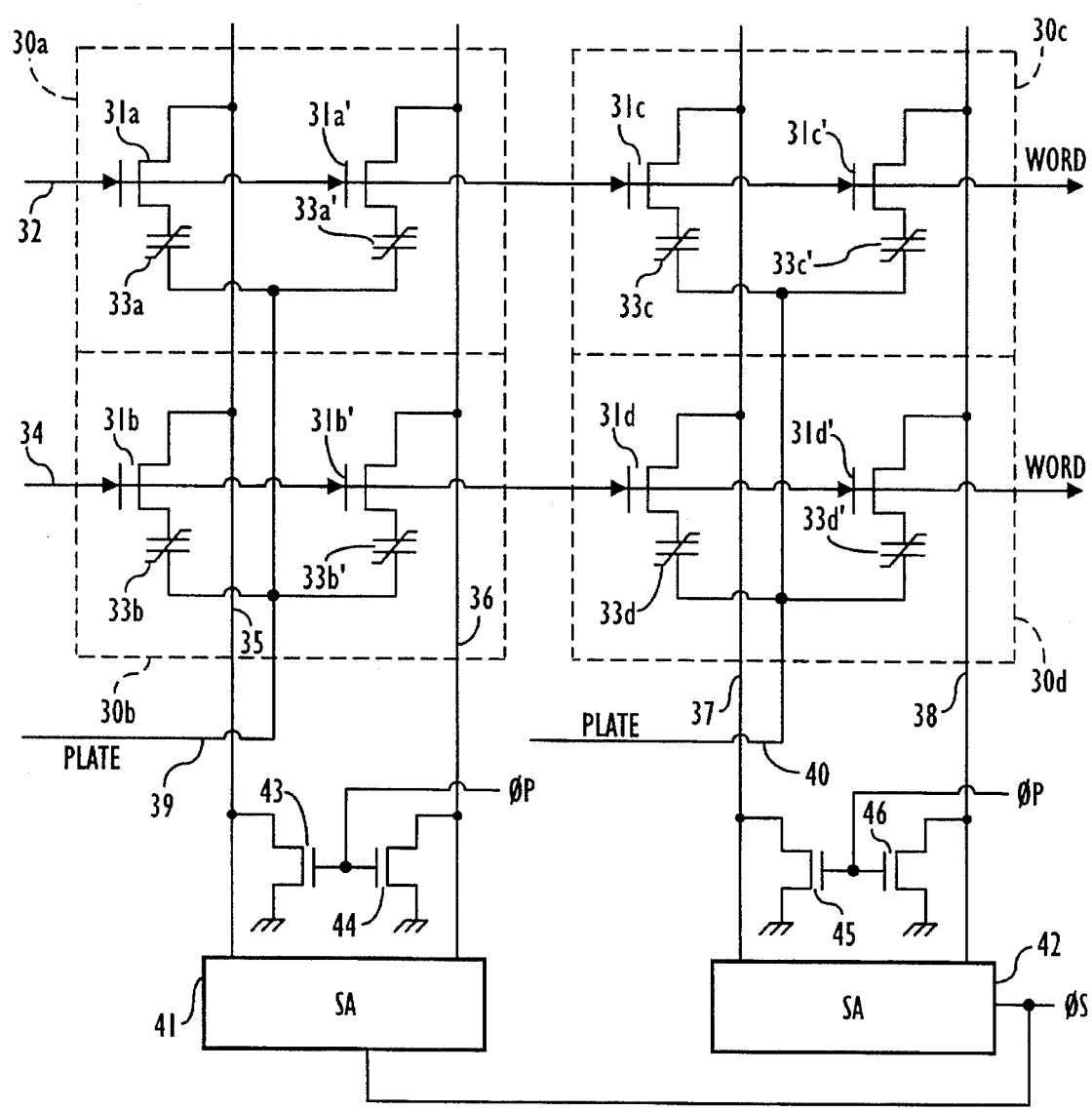
FIG. 5 shows a schematic circuit diagram of a conventional semiconductor memory device.
Figure 6:
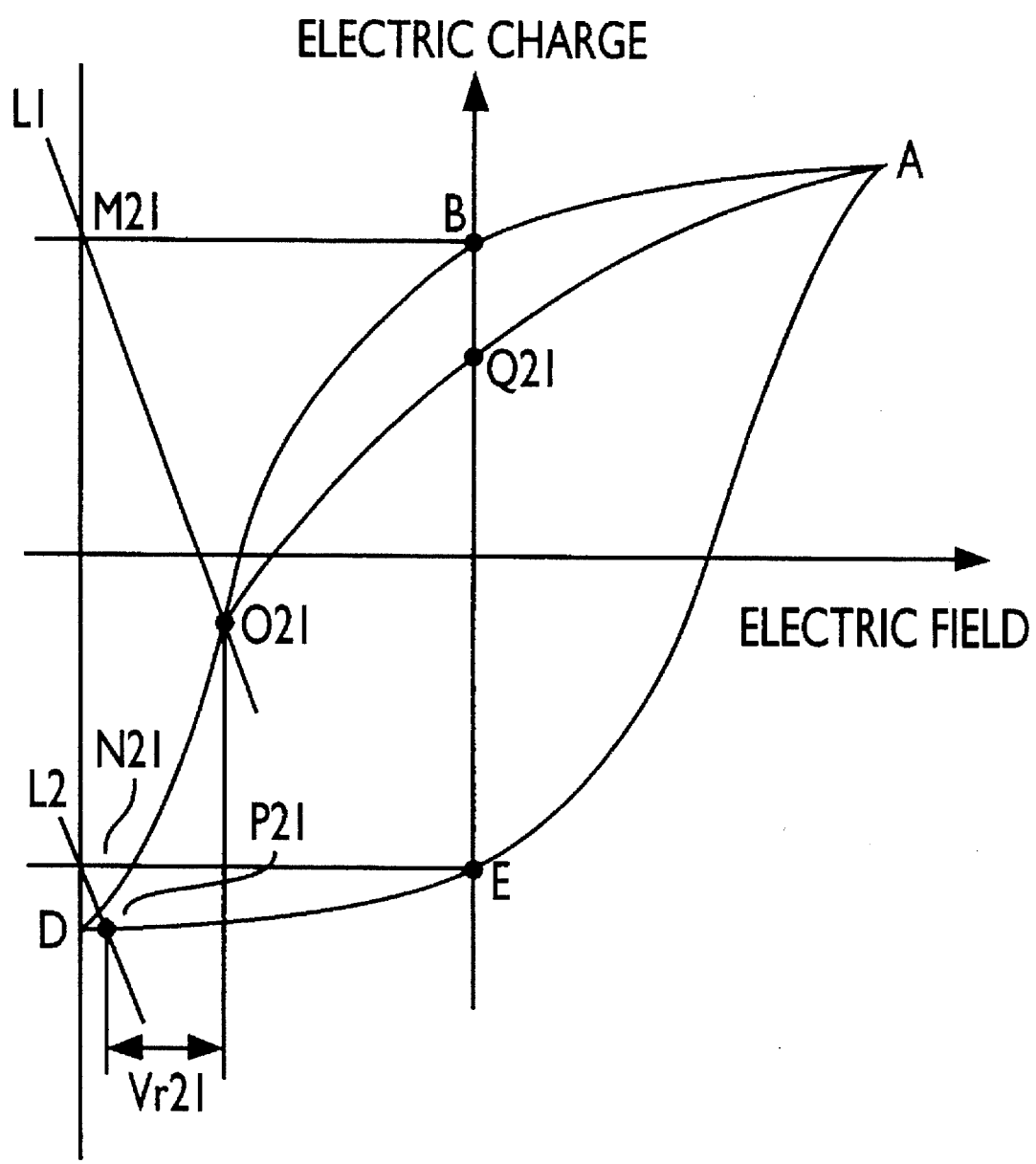
FIG. 6 is a hysteresis curve illustrating how data is read out from memory cells of a conventional semiconductor memory device.
Figure 7:
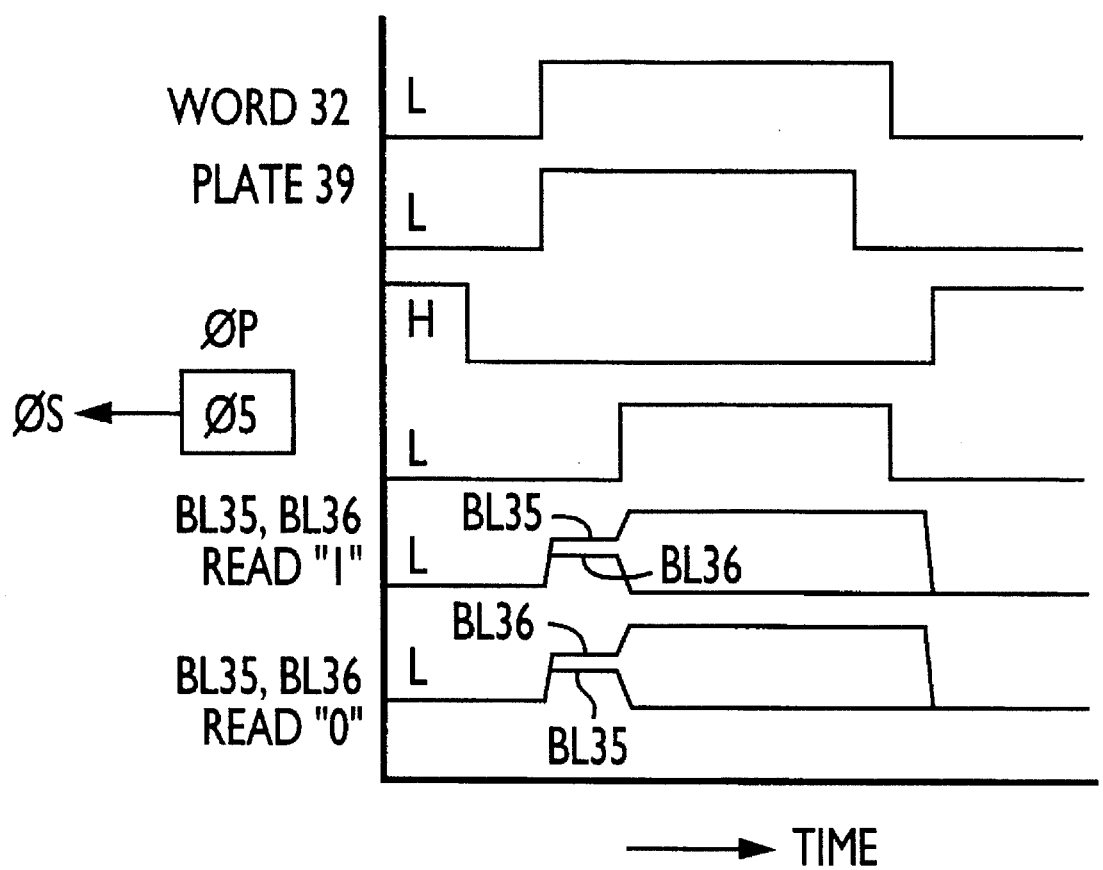
FIG. 7 shows a timing chart of the operation of a conventional semiconductor memory device.
Figure 8:
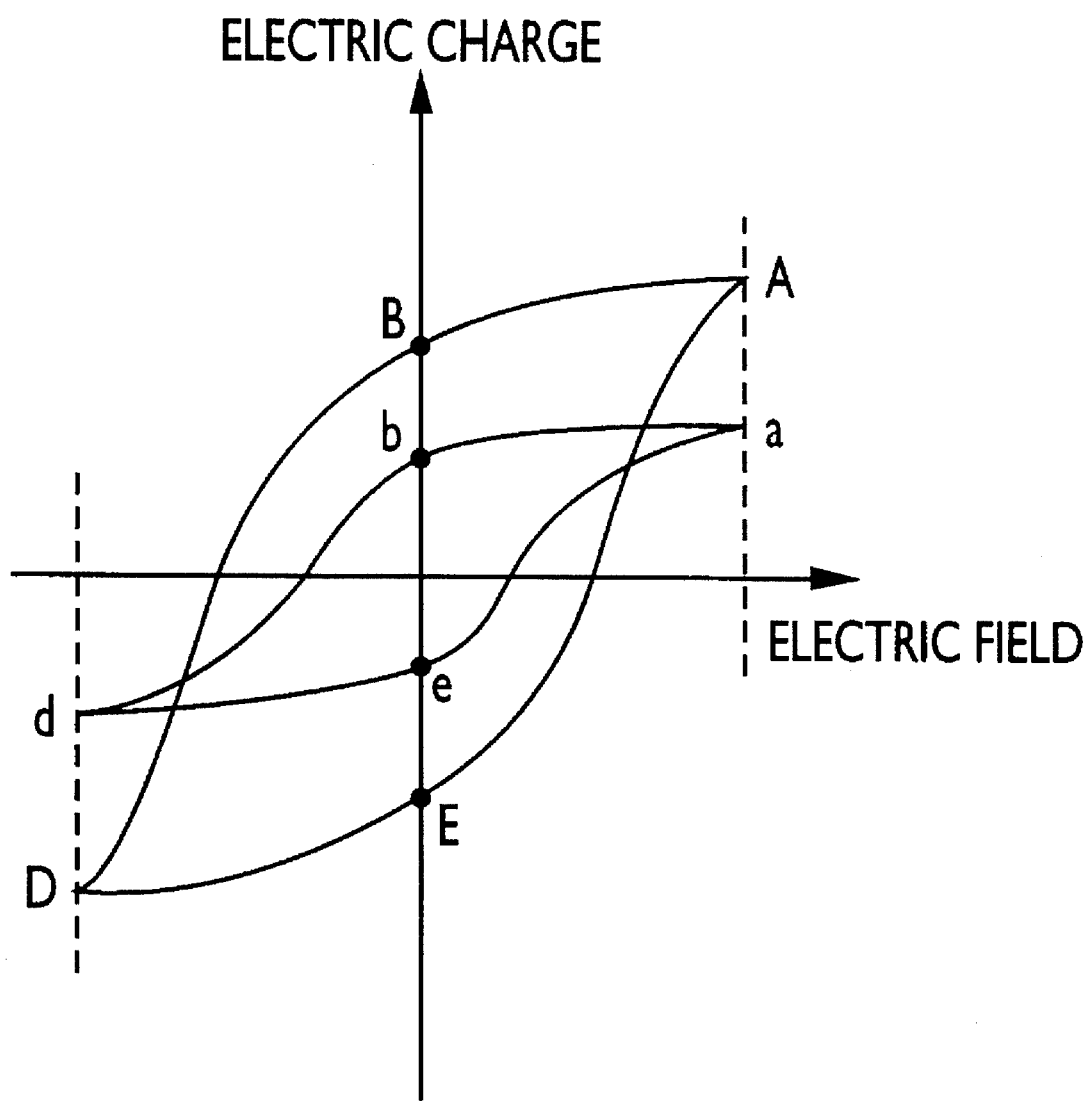
FIG. 8 illustrates the deteriorating effects of repeated writes on the ferroelectric film of a conventional semiconductor memory device.

FIG. 4 shows the relation between the number of data read-outs and the residual charge in both the semiconductor memory device of the present invention and as taught by prior art. Lines (a) and (b) represent test results of a conventional semiconductor memory device. Line (a) shows the result of a ferroelectric capacitor storing data value "0," and line (b) shows the result of a ferroelectric capacitor storing data value "1." Line (c) represents the test result of a ferroelectric capacitor in an embodiment of the present invention.

In a conventional semiconductor memory device, the ferroelectric film of a capacitor storing data value "0" is not deteriorated because its polarization does not reverse. As line (a) indicates, the residual charge thus does not decrease, even as the number of read-outs increases. However, a polarization of a ferroelectric capacitor storing data value "1" is reversed, and as line (b) shows, the residual charge decreases when the number of read-outs exceeds a limit.

As discussed above, decreasing residual electric charges may cause data to be erroneously read from the memory cell. Because the rate of decrease in residual charge is a limiting factor on the life of the semiconductor memory device, the present invention provides for an improved semiconductor memory device with a prolonged life by decreasing the number of times the polarization of the ferroelectric capacitors will be reversed.

Accordingly, as shown by line (c), the loss of residual charges of ferroelectric capacitors storing either data value "0" or data value "1" is decreased, as the number of polarization reversals is less than that of a conventional semiconductor memory device in which a data value "1" is written.

As described above, one embodiment of the semiconductor memory device as taught by this invention is comprised of (1) reverse and rewrite means for reversing and rewriting the data read out from a memory cell; (2) memory means for memorizing whether data read out from a memory cell is reversed in rewriting; and (3) judging means for judging whether data read out from a memory cell should be output directly or in reverse.

Variations on this embodiment of the present invention are possible. For example, the above embodiment adds a dummy memory cell to each word line. However, at least one dummy cell may be added to each memory cell block activated at one time.

The above embodiment also shows that each memory cell or dummy memory cell comprises two N-channel MOS transistors and two ferroelectric capacitors. However, a memory cell may alternatively comprise one MOS transistor and one ferroelectric capacitor.

Still another variation of the present invention concerns the capacitor material: the dielectric film of the memory cell capacitor is not limited to ferroelectric film, but may instead be of materials such as silicon oxide or silicon nitride.

Of course, it should be understood that a wide range of changes and modifications can be made to the preferred embodiment described above. It is therefore intended that the foregoing detailed description be understood that it is the following claims, including all equivalents, which are intended to define the scope of this invention.

What is claimed is:

1. A semiconductor memory device comprising: a plurality of memory cells for storing data;

a memory means for memorizing a signal for judging whether said data are stored in a reversed state;

a judging means for judging whether said data should be reversed when output, based on said signal memorized by said memory means; and a reverse and rewrite means for reversing said data after said data is output, and rewriting said reversed data into said memory cells.

2. A semiconductor memory device according to claim 1, wherein each of said memory cells comprises a memory cell capacitor and a transistor.

3. A semiconductor memory device according to claim 2, wherein said memory cell capacitor is a ferroelectric capacitor.

4. A semiconductor memory device according to claim 1, wherein said memory means include a plurality of dummy memory cells, each of which comprises a memory cell capacitor and a transistor.

5. A semiconductor memory device according to claim 1, wherein said plurality of memory cells are divided into blocks activated at the same time, and said memory means is connected to each of said blocks.

6. A semiconductor memory device according to claim 5, wherein each of said memory cells comprises a memory cell capacitor and a transistor.

7. A semiconductor memory device according to claim 5, wherein said memory means includes a plurality of dummy memory cells, each of which comprises a memory cell capacitor and a transistor.

8. A method of storing data in a semiconductor memory device comprising the steps of:

storing data in a plurality of memory cells;

memorizing a signal indicating whether said data are stored in a reversed state;

judging whether said data should be reversed when output, based on said signal;

reversing said data after said data is output; and rewriting said reversed data into said memory cells.

9. A method of storing data in a semiconductor memory device according to claim 8, wherein each of said memory cells comprises a memory cell capacitor and a transistor.

10. A method of storing data in a semiconductor memory device according to claim 9, wherein each of said memory cell capacitors is a ferroelectric capacitor.

11. A method of storing data in a semiconductor memory device according to claim 8, wherein said signal is memorized by in a dummy memory cell comprising a memory cell capacitor and a transistor.

12. A method of storing data in a semiconductor memory device according to claim 8, wherein said plurality of memory cells are divided into blocks activated at the same time, and said memory means is connected to each of said blocks.

13. A method of storing data in a semiconductor memory device according to claim 12, wherein each of said memory cells comprises a memory cell capacitor and a transistor.

14. A method of storing data in a semiconductor memory device according to claim 12, wherein said signal is memorized in a dummy memory cell comprising a memory cell capacitor and a transistor.

* * * * *